United States Patent [19]
Hayes

[11] Patent Number: 5,861,323
[45] Date of Patent: Jan. 19, 1999

[54] PROCESS FOR MANUFACTURING METAL BALL ELECTRODES FOR A SEMICONDUCTOR DEVICE

[75] Inventor: Donald J. Hayes, Plano, Tex.

[73] Assignee: MicroFab Technologies, Inc., Plano, Tex.

[21] Appl. No.: 270,661

[22] Filed: Jun. 6, 1994

[51] Int. Cl.$^6$ .......... H01L 21/288; H01L 21/58; H01L 21/60

[52] U.S. Cl. ............. 438/111; 438/615; 228/180.22

[58] Field of Search .......... 437/183; 228/180.22; 257/737, 738; 438/615, 343, 111, 112

[56] References Cited

U.S. PATENT DOCUMENTS

| | | | |
|---|---|---|---|
| 5,118,027 | 6/1992 | Braun et al. | 228/180.2 |
| 5,129,573 | 7/1992 | Duffey | 228/180.1 |
| 5,193,738 | 3/1993 | Hayes | 228/180.2 |
| 5,208,980 | 5/1993 | Hayes | 29/890.1 |
| 5,229,016 | 7/1993 | Hayes et al. | 222/590 |
| 5,246,880 | 9/1993 | Reele et al. | 437/183 |
| 5,377,902 | 1/1995 | Hayes | 228/254 |
| 5,377,961 | 1/1995 | Smith et al. | 266/237 |
| 5,411,602 | 5/1995 | Hayes | 148/23 |
| 5,415,679 | 5/1995 | Wallace | 75/331 |
| 5,431,332 | 7/1995 | Kirby et al. | 228/246 |
| 5,560,543 | 10/1996 | Smith et al. | 239/102.2 |
| 5,643,353 | 7/1997 | Wallace et al. | 75/332 |

FOREIGN PATENT DOCUMENTS

58-35935  3/1993  Japan .

*Primary Examiner*—David Graybill
*Attorney, Agent, or Firm*—Locke Purnell Rain Harrell

[57] ABSTRACT

Process for manufacturing arrays of metal balls for interconnect testing and/or interconnect bonding of microelectronic devices and the like with substrates are formed by securing metal balls in predetermined patterns of apertures in an insulating membrane or film. The pattern of apertures corresponds with the pattern of metal interconnect pads on a microelectronic device or the like and the corresponding pattern of interconnect pads on the substrate. The metal ball arrays may be used for testing and/or may be heated and reflowed to bond the microelectronic device to the substrate.

27 Claims, 8 Drawing Sheets

PROCESS FOR MANUFACTURING METAL BALL ELECTRODES FOR A SEMICONDUCTOR DEVICE

This invention relates generally to electrically and physically interconnecting microelectronic devices to substrates. More particularly, but not by way of limitation, it relates to arrays of metal balls for interconnecting microelectronic devices to substrates and to methods of manufacturing such metal ball arrays.

Figure 1:
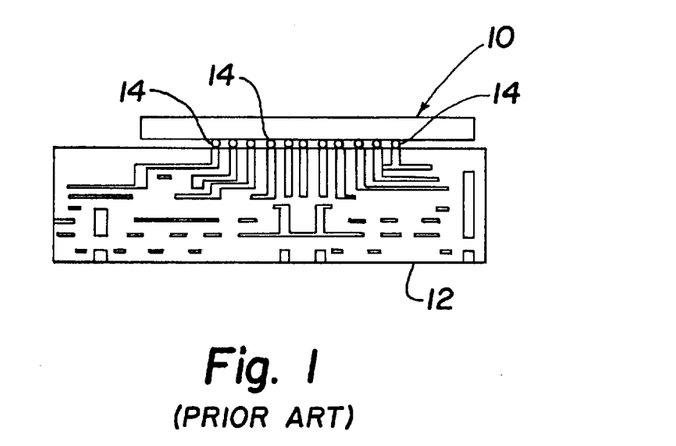
FIG. 1 is a simplified pictorial illustration of a microelectronic device bonded to a substrate.
Figure 2:
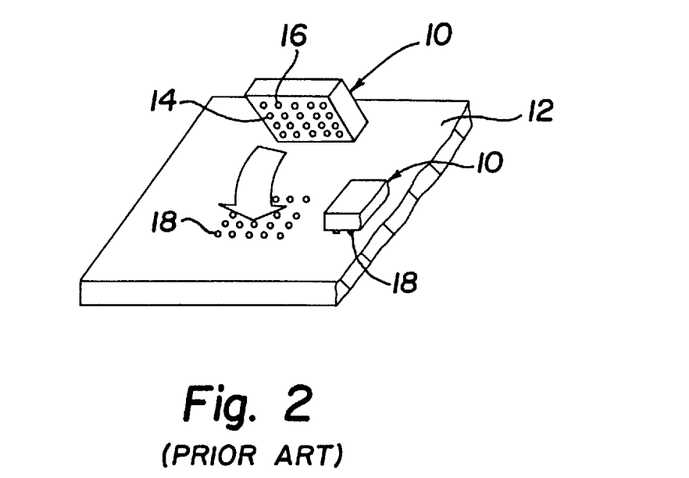
FIG. 2 is a simplified pictorial illustration of one step in the prior art process of bonding of a microelectronic device to a substrate.

In many high density electronic assemblies microelectronic devices are bonded to substrates with solder interconnections or the like. Ordinarily, a surface mountable package, integrated circuit chip or other microelectronic device is operatively joined to make electrical interconnections with and be physically supported by a substrate by a solder reflow process as illustrated in FIGS. 1 and 2. Prior to the solder reflow process the interconnect material between the microelectronic device 10 and the substrate 12 is in the form of solder bumps or balls 14 and placed on the wettable metal pads 16 of the microelectronic device 10 by various prior art processes such as 1) deposition through a mask plus solder reflow, 2) electroplating plus solder reflow, and 3) pick-and-place of solder bumps or balls, etc. The bonding process conventionally utilizes solder bumps deposited on wettable metal pads 16 on the microelectronic device 10 and/or device 10. The upside-down surface mount package (sometimes referred to as a flip chip) is then inverted (see FIG. 2) so that the solder bumps or balls 14 are aligned with a matching footprint of solder wettable connect or bond pads 18 on substrate 12 or the like. When heat is applied, all joints or interconnects between the wettable metal pads 16 on the microelectronic device 10 and the solder-wettable connect or bond pads 18 on substrate 12 are made simultaneously by reflowing the solder. Typically, the interconnects are made with solder bumps or balls 14 which are about fifty (50) to about one hundred fifty (150) $\mu$m in diameter for an integrated circuit device and about four hundred (400) to about eight hundred (800) $\mu$m in diameter for a ball grid array device. Several hundred to several thousand solder bumps or balls may be employed for each microelectronic device 10. Electronics manufacturing and assembly processes are moving toward even more interconnects per microelectronic device and since the interconnects are closer together, solder bumps or balls of smaller size are required.

One prior art process for making solder bumps involves deposition of solder through a mask. In this process, solder is evaporated through apertures or holes in a metal mask aligned over the metal pads on a microelectronic device or the like while the metal pads are surrounded by insulation. In this way an array of solder deposits is created on the surfaces of the metal pads. Reflow in a furnace homogenizes the solder deposits and brings the solder deposits to a partially spherical shape or bump since the metal pads are solder-wettable and the insulation is not. The quality and repeatability of the solder alloy produced by this process, however, is poor. Furthermore, since the masks get coated with the solder materials and must be continuously cleaned or replaced, the overall cost can be prohibitive.

An electroplating plus reflow process can also be used to make solder beads or balls. This process requires application of photoresist material to the microelectronic device; exposure to a masked ultraviolet beam to define a pattern in the photoresist material; development of the pattern in the photoresist material; and then electroplating the solder composition. Reflow in a furnace brings the solder deposits to a partially spherical shape. The photolithography and solder plating steps, however, present environmental waste treatment problems. Furthermore, the solder alloy is not consistent and usually contains impurities.

In the pick-and-place method solder balls are created off-line using processes developed for making lead shot. Solder balls which meet specifications are arranged in grooves in a tray and a robot arm picks up solder balls one at a time and, with the application of heat and pressure, positions each solder ball on an individual metal pad on the microelectronic device or the like. The equipment needed for this process, however, is quite expensive and too slow for effective volume production.

The shortcomings and disadvantages of the prior art, as briefly outlined above, has severely limited the use of solder reflow interconnects for microelectronics and an unsatisfied need exists for means or methods to provide interconnects between the metal pads on a microelectronic device and connect pads on the substrate which do not involve high costs; which produce solder alloy of high purity and with little oxides; and which produce solder balls of precise and accurate shape and size.

The present invention provides methods and apparatus for producing metal ball arrays for interconnect testing and/or interconnect bonding of microelectronic devices to a substrate which overcomes the disadvantages of the prior art. The term "microelectronic device" is used herein in its broad sense to include surface mountable packages as well as bare chips and other semiconductor circuit devices commonly referred to as integrated circuit chips or microelectronic devices.

The array of the invention comprises a thin insulating membrane, film or the like with top and bottom opposed surfaces and apertures of predetermined diameter extending therethrough arranged in a pattern which coincides with the pattern of the metal pads of a microelectronic device or the like. A metal ball is positioned in each aperture. The diameter of each metal ball is sufficiently larger than the aperture to prevent the ball from falling through the aperture in which it is placed but sufficiently small to allow a portion of each metal ball to protrude below the bottom surface of the insulating membrane. The metal balls thus extend through both the top and bottom surfaces of the membrane and form electrical interconnects extending through the membrane. The assembly may be used to electrically connect the metal pads of microelectronic devices with the connect pads of a substrate by appropriately positioning the membrane assembly between the microelectronic device and the substrate. An adhesive layer may be positioned on the bottom and/or top surface of the insulating membrane to aid in temporarily securing the assembly in place.

The metal balls are preferably formed by an ejection process to assure uniformity of size, composition, etc. A number of balls in excess of the number of apertures is placed on the membrane and the membrane moved relative to the balls until one ball occupies each aperture and the excess has been removed. Arrays of metal balls may thus be produced by forming holes of the appropriate size in the desired pattern and filled with solder balls to form interconnect arrays for any desired arrangement. Other advantages and features of the invention will become more readily understood from the following detailed description taken in connection with the appended claims and attached drawing, wherein like reference numerals have been applied to like elements, in which:

FIG. 11a is a diagrammatic representation of an alternate automated fabrication system for manufacturing solder ball arrays; and FIG. 11b is a simplified pictorial illustration of the jet array printhead of FIG. 11a.

Figure 3:
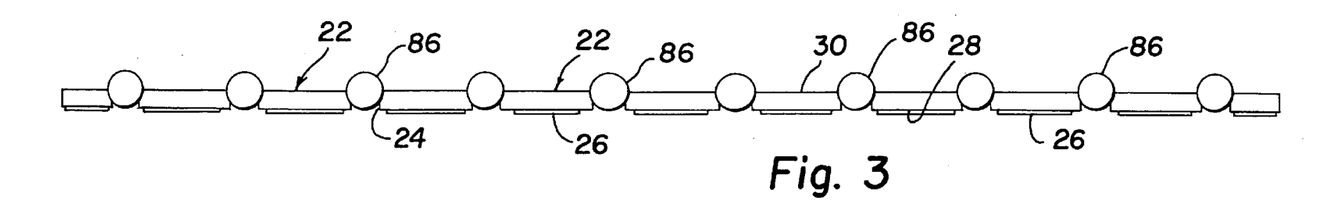
FIG. 3 is a side elevational view of a metal ball array constructed in accordance with the invention.

Referring to the drawing and FIG. 3 in particular, shown therein and generally designated by reference character 20 is a metal ball array constructed in accordance with the present invention. As illustrated, the metal ball array 20 comprises an array membrane or substrate 22 containing a predetermined pattern of apertures 24 of precise size and shape. In the preferred embodiment, the array membrane or substrate 22 is formed of insulating material which may be a polymer (such as polyamide, mylar, teflon, etc.), flux, adhesive, etc. The thickness of array membrane 22 should be between about fifteen (15) μm and about one hundred twenty-five (125) μm, depending on the size of metal balls used. The size of the apertures 24 is determined by the size of metal balls 86 required for a particular application. In most cases the metal balls 86 are from about fifty (50) μm to about eight hundred (800) μm in diameter. It will be appreciated that apertures 24 must be of a size to allow a predetermined portion of each metal ball 86 to project below the bottom surface 28 of the array membrane 20 and yet hold the metal balls 86 in position in the apertures 24 without allowing the metal balls 86 to fall through the apertures 24. It will be appreciated that apertures 24 can be of different sizes to accommodate metal balls 86 of different sizes if so required in any particular application. The distance between apertures 24 may be from as small as the diameter of the apertures 24 to as large as ten times the diameters of the apertures 24 or more.

Adhesive layer 26 may be applied to the lower or bottom surface 28 of the array membrane 22 to maintain the array membrane 22 in the desired position with respect to the microelectronic device 10 and/or substrate 12. It will be appreciated that an adhesive layer may be applied to both the top or upper surface 30 and the lower or bottom surface 28 if desired or required in any particular application.

Figure 4:
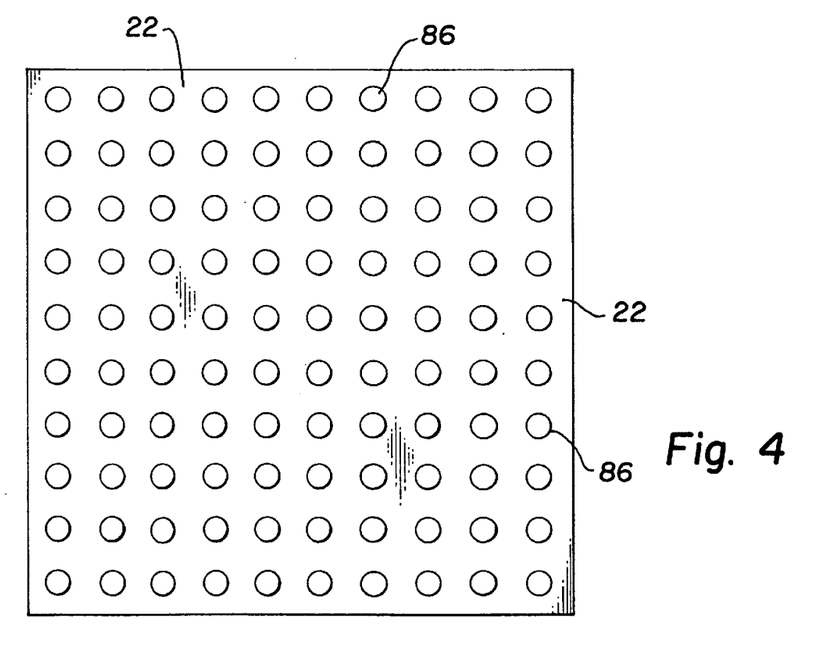
FIG. 4 is a top plan view of a metal ball array constructed in accordance with the invention.

FIG. 4 illustrates an exemplary metal ball array 20 which is generally square and has apertures 24 distributed in a generally uniform pattern. It will be appreciated that array membrane 24 could be of any desired shape and that the pattern of apertures 24 in array membrane 24 may be arranged in any desired or necessary pattern.

Metal balls may be formed of any electrically conductive metal and the metal ball array may be used for interconnect testing as well as interconnect bonding of devices to substrates. In the preferred embodiments the balls are solder, copper or copper coated with solder, etc. If the metal ball array 20 is used for bonding, the metal ball is usually a solder alloy. When used for interconnect and testing, a metal with a higher melting point (such as copper, etc.) is ordinarily used.

In order to be commercially useful, the metal balls (e.g., solder, copper, etc.) must be inexpensively produced with very precise diameters and of different desired diameters with great accuracy and the balls must be of high purity with little, if any, oxides. Furthermore, the apertures must be formed at precise and repeatable shapes, sizes, arrangements, etc., in the dielectic array membrane.

Figure 5:
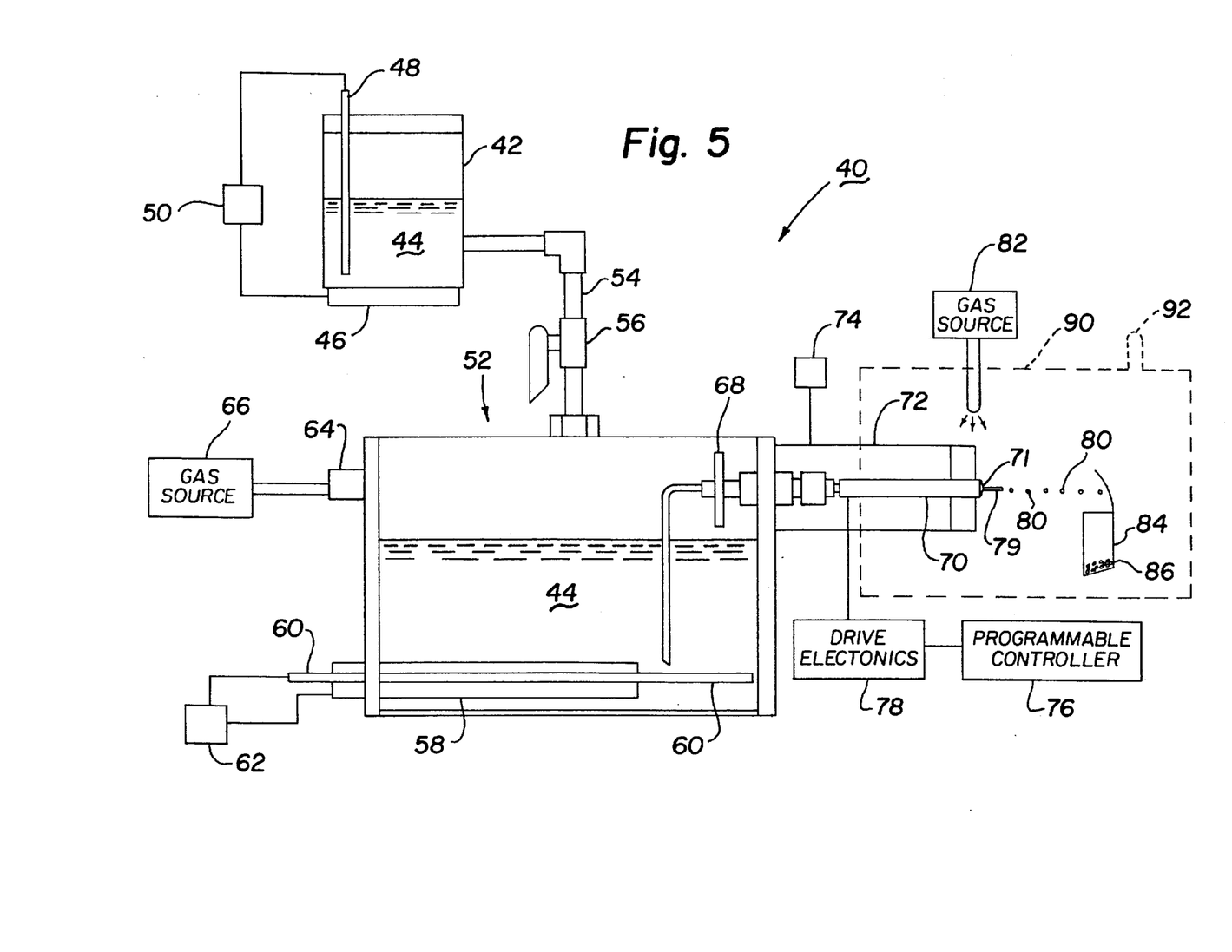
FIG. 5 is a simplified pictorial illustration of apparatus suitable for producing spherically-shaped solder balls having precisely controlled diameters for use in fabricating arrays of the invention.

FIG. 5 illustrates a device for providing metal balls having a very precise diameter. For explanatory purposes, solder will be described as the metal although it will be appreciated that other metals may be used. Solder ejecting device 40 ejects spherically-shaped balls of liquid solder alloys which are caught in a container 84. The solder ejecting device 40 comprises a preload reservoir 42 for initially receiving and holding the solder alloy 44. Heating element 46 is operatively positioned in preload reservoir 42 to maintain the solder alloy 44 in the liquid state. Thermocouple 48 (or other temperature monitoring device) is used to control power source 50 so the solder 44 will be maintained at the desired temperature. An ejection chamber 52 is connected to the outlet of preload reservoir 42 through conduit 54 and valve 56 to allow liquid solder 44 to flow from the preload reservoir 42 into ejection chamber 52. Oxides and impurities tend to stay at the top of the liquid 44 in the preload reservoir 42 and do not enter the ejection chamber 52. If high purity solder alloys or metals other than solder are used, the preload chamber may not be necessary. Heating element 58 is positioned in ejection chamber 52 and controlled by power source 62 to maintain the solder 44 at the desired temperature.

The ejection chamber 52 is pressurized through inlet port 64 by inert gas from gas source 66 which forces liquid solder 44 through filter 68 into the ejection device 70 to purge the system in preparation for operation. The ejection chamber 52 is pressurized during operation with inert gas to eliminate any oxygen in the atmosphere above the liquid solder 44. Heater 72, connected to power source 74, surrounds ejection device 70 and controls the temperature of the liquid solder 44 within the ejection device 70. Programmable controller 76 provides activating signals to drive electronics 78 causing ejection device 70 (which is a continuous type ejection device) to form drops 80 of liquid solder 44 from the liquid solder stream 79 ejected from orifice 71 under pressure from gas source 66. Upon cooling, the drops 80 of liquid solder 44 become solidified spherical solder balls 86 which are caught in container or catcher 84.

The space surrounding the drops 80 of liquid solder 44 between ejection device 70 and container 84 is filled with a relatively inert gas such as nitrogen or helium from gas source 82. Oxygen is thus eliminated from the path traveled by the drops 80 to avoid oxidation. Chamber 90 must be sufficiently long to allow the drops 80 of liquid solder to solidify before hitting catcher 84.

It will be appreciated that a chamber or housing 90 enclosing the path traveled by the drops 80 of liquid solder 44 and the container or catcher 84 will further insure that drops 80 will not be subject to oxidation. The housing may be used to provide a positive gas flow from gas source 82 to outlet 92. Thus oxides and/or contaminants removed from the space will flow out outlet 92 along with the inert gas and will not be deposited on the drops 80. The inert atmosphere also greatly enhances formation of generally spherical drops 80 of liquid solder 44 which solidify into generally spherical solder balls 86.

Ejection device 70 is an electromechanical transducer which may be a piezoelectric, electromagnetic or other mechanical source which causes the liquid solder stream 79 to break up into drops 80 of liquid solder 44 in response to an excitation signal from drive electronics 78. If the metal used in making the metal balls has a melting point above the active range of the transducer, a design should be used in which the transducer will be removed from the hot zone and be mechanically coupled to the molten fluid tube of the ejection device. For example, most piezoelectric transducers must be kept below 300° C. to function properly. If 63/37 tin/lead solder (which has a melting point of about 185° C.) is ejected, the transducer may remain in the hot zone and function well. If copper (which has a melting point of about 1000° C.) is ejected, the transducer may be removed from the hot zone and mechanically coupled to the molten fluid tube.

Ejection device 70 is controlled to produce solder balls 86 which are precisely spherical and of uniform diameter. In the preferred embodiment, ejection device 70 has an orifice or nozzle opening 71 of about ten (10) to about three hundred fifty (350) $\mu$m in diameter and is excited with a signal from drive electronics 78 having a frequency between about five hundred (500) to one million (1,000,000) hertz. Changes in the volume if each drop 80 are controlled by the excitation frequency provided to ejection device 70 by drive electronics 78. Small changes in volume of the drops 80 (and thus diameter of the solder balls 86) require only changes in excitation frequency applied to ejection device 70. Large changes require changes in the size of orifice 71 in ejection device 70.

Figure 6:
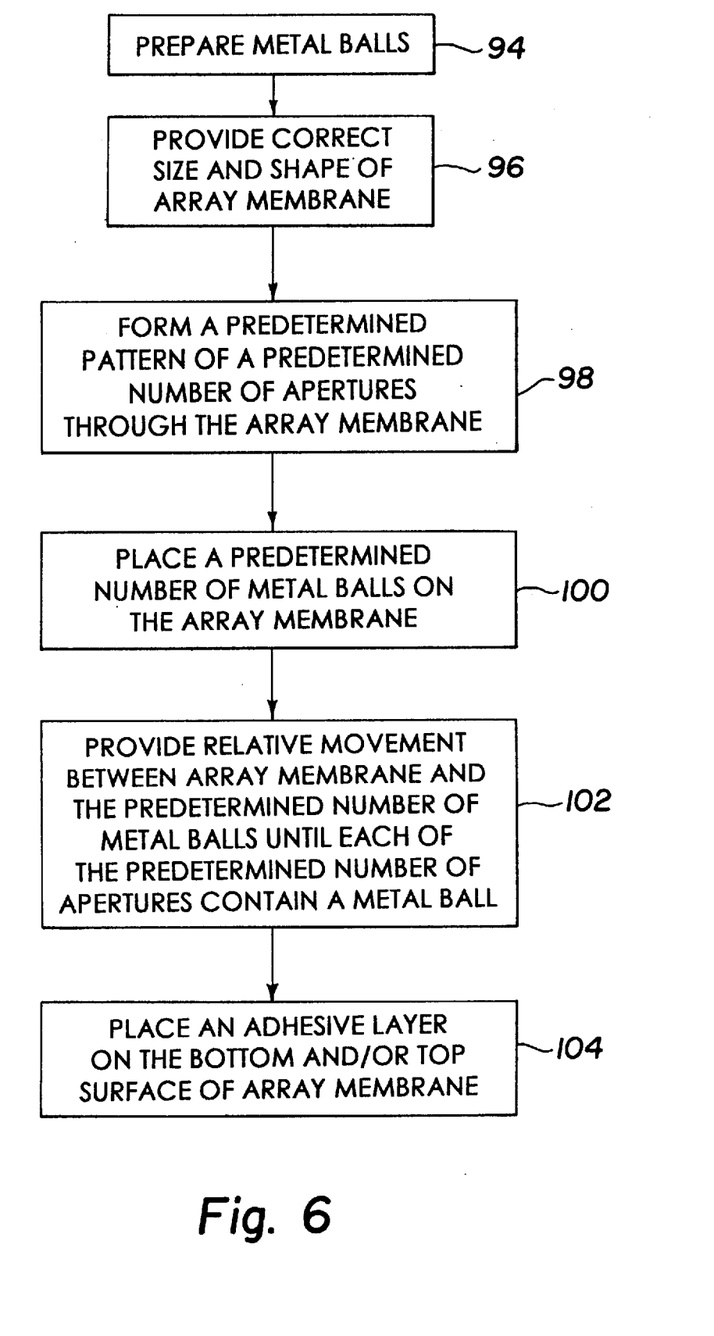
FIG. 6 is a flow diagram of a process of manufacturing metal ball arrays in accordance with the invention.

A flow chart of the preferred process of the invention is shown in FIG. 6. In step 94 solder or metal balls 86 of predetermined diameter, composition, etc., are prepared by any suitable process. The correct size and shape of the array membrane 22 is prepared in step 96. In step 94 the correct size and pattern of apertures is formed in the array membrane. In the preferred embodiment an excimer laser or the like is used to ablate the material of the array membrane to form the correct size and pattern of apertures. (If desired, an adhesive layer 26 may be placed on the lower surface 28 and/or the upper surface 30 of the array membrane 22 as shown in FIG. 3.)

The metal balls are placed on the array membrane in step 100. The number of balls must at least equal the number of apertures in the array membrane. In step 102 relative movement is provided between the array membrane and the solder or metal balls until a ball 86 is deposited in each aperture 24. The ball array is then ready for use.

Figures 7, 8:
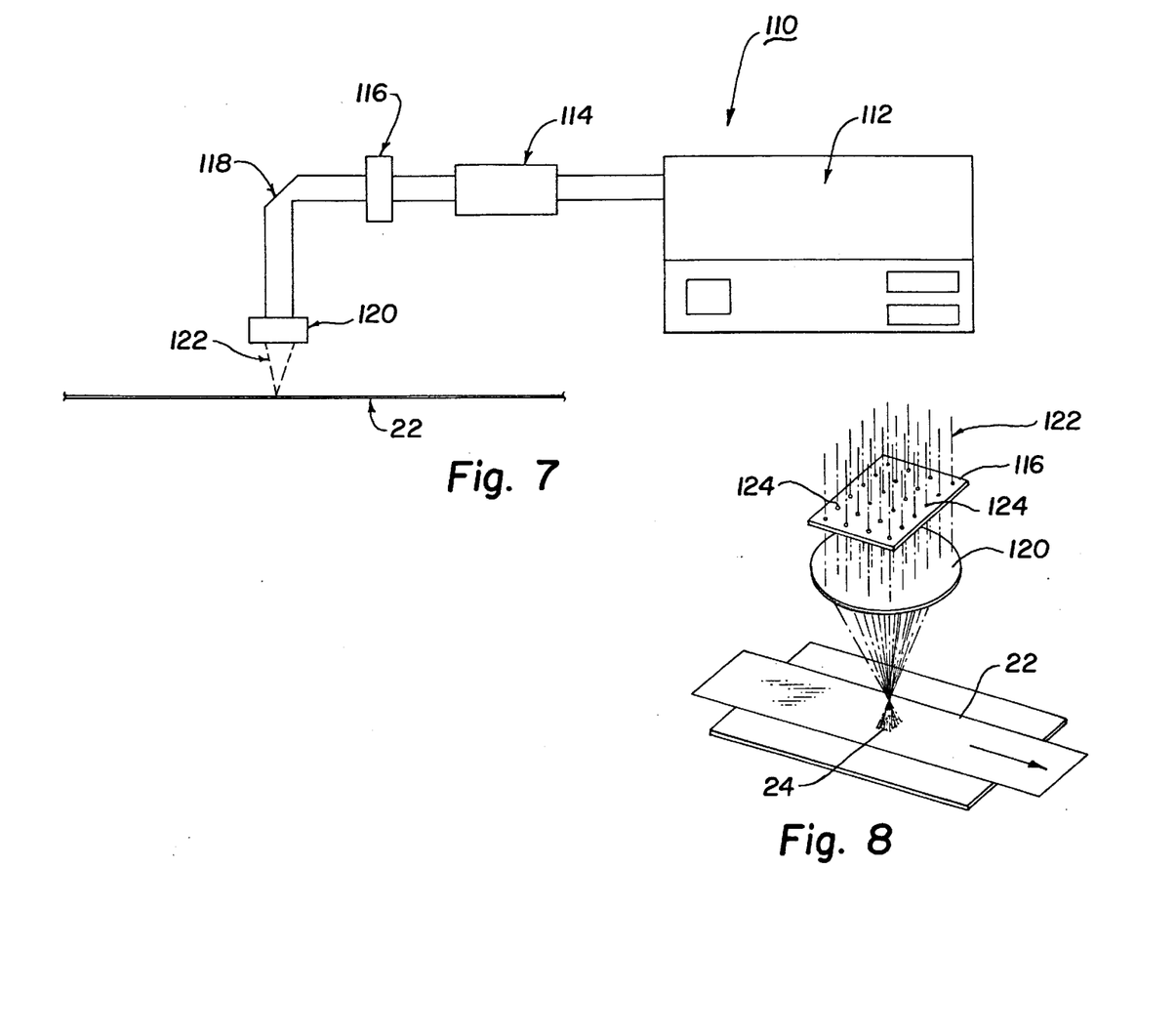
FIG. 7 is a simplified pictorial illustration of apparatus for ablating apertures in insulating membrane in accordance with the invention.
FIG. 8 is a simplified pictorial illustration of the aperture-forming portion of the apparatus of FIG. 7.

FIG. 7 illustrates use of an excimer laser ablation system 110 to form the apertures 24 in array membrane 22. System 110 includes an excimer laser 112 which emits high energy pulses of ultraviolet radiation 122. The ultraviolet radiation 122 is passed through attenuator 114 which adjusts the intensity level of the radiation. A mask 116 with a pattern of apertures corresponding to the pattern of apertures to be in array membrane 22 is positioned between the attenuator and a mirror 118 which reflects the ultraviolet radiation 122 to focusing optics 120. Optics 120 focuses the ultraviolet radiation 122 onto the array membrane 22 and the focused radiation ablates the array membrane 22 to form apertures.

The relationship of the mask 116, focusing optics 120 and array membrane 22 is shown in detail in FIG. 8. The ultraviolet radiation 122 passing through apertures 124 in the mask 116 forms individual beams of ultraviolet radiation 122 which are focused by focusing optics 120 to ablate the desired pattern of apertures 24 in array membrane 22. Mask 116 reflects all ultraviolet radiation 122 except that passing through apertures 124. Typically, the size of the pattern of apertures 124 in the mask 116 is five to ten times the size of the pattern of apertures 24 to be ablated in array membrane 22.

After ablation of the desired pattern of apertures 24, the array membrane 22 is moved in preparation for the next pattern of apertures 24 to be ablated therein.

Figure 9:
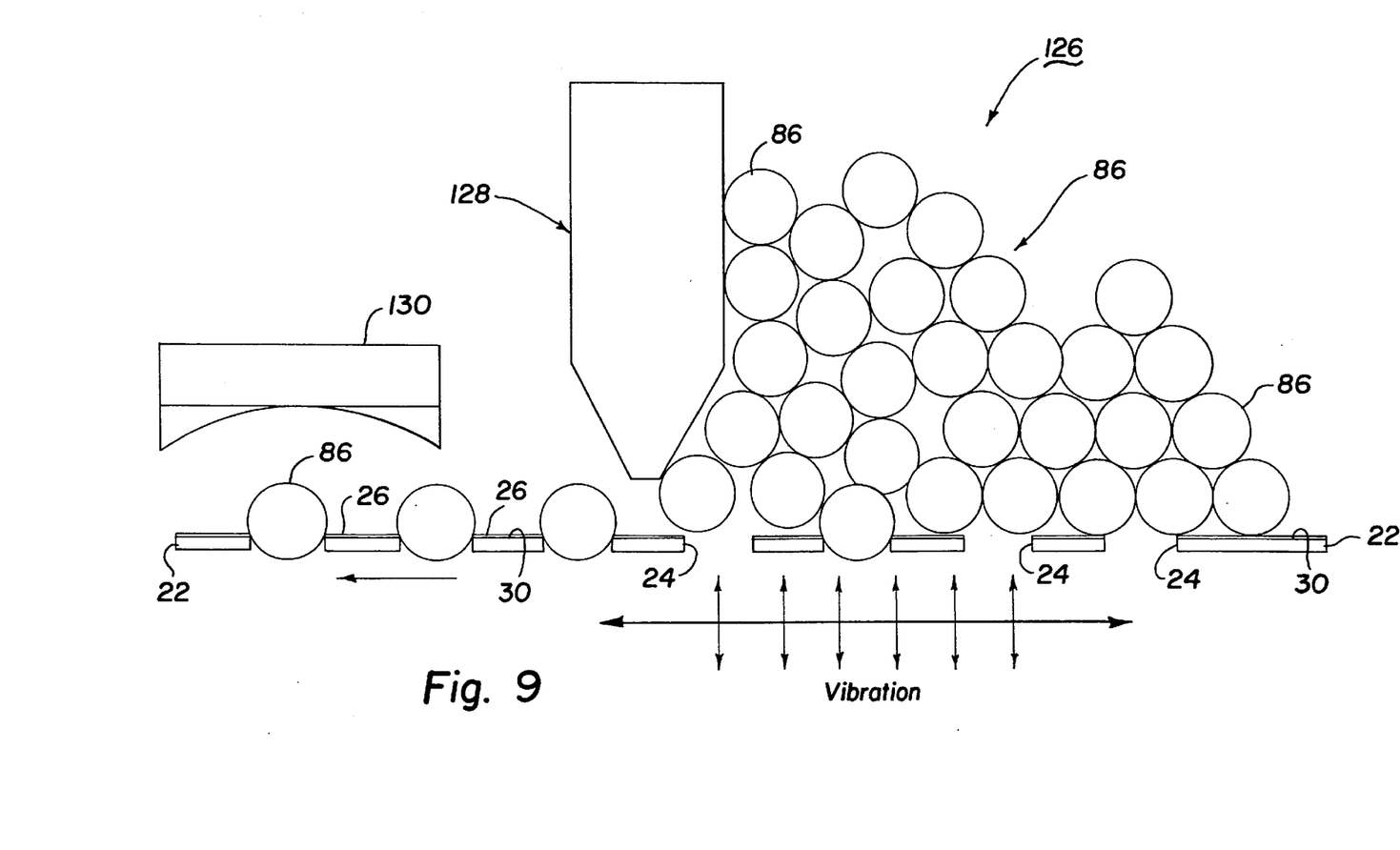
FIG. 9 is a diagrammatic representation of a system for depositing metal balls in apertures in an insulating membrane.

FIG. 9 illustrates a system 126 for depositing metal ball 86 in each aperture 24 in array membrane 22. System 126 includes a doctor blade 128 positioned a predetermined distance above the upper surface 30 of array membrane 22. The predetermined distance is, of course, less than the diameter of the balls 86 to be deposited in apertures 24 but greater than the height of the portion of the ball 86 which protrudes above the upper surface 30 of array membrane 22 when the ball 86 is in aperture 24. Means (not shown) is provided to move the array membrane 22 (from right to left as shown in FIG. 9). A supply of balls 86 is placed on the array membrane 22 ahead of the doctor blade 128 and, as the strip of array membrane 22 is moved, balls 86 are deposited into all the apertures 24 in array membrane 22. It will be appreciated that array membrane 22 may be vibrated as it moves to assist in depositing balls 86 in apertures 24. As the array membrane 22, with solder or metal balls 86 deposited in the apertures 24, moves past the doctor blade, heat may be applied by attaching station 130 to temporarily soften adhesive layer 26 (or array membrane 22 if an adhesive layer is absent) to attach and assure that the solder or metal balls 86 will not fall out of apertures 24 during later handling of the array 20.

It will be appreciated that it is only necessary to provide relative movement between the membrane 20 and the doctor blade 128. Accordingly, the doctor blade and attaching station 130 could be moved relative to a stationary strip of array membrane 22 with the same end result. It will be also appreciated that other arrangements may be used to deposit metal balls in the apertures of array membrane 22. For example, the balls 86 may be directly ejected into the apertures 24. Alternatively, a vacuum source below the lower surface of array membrane 22 may be used to draw metal balls 86 into apertures 24 of the array membrane 22 and an air knife or the like used to remove any metal balls 86 not placed in an aperture 24. The array membrane 22 may also be placed in a vibrating platform tilted at a predetermined angle. Metal balls 86 placed above the array membrane 22 would move down (due to gravity) and across the array membrane 22 to fill the apertures.

Figure 10:
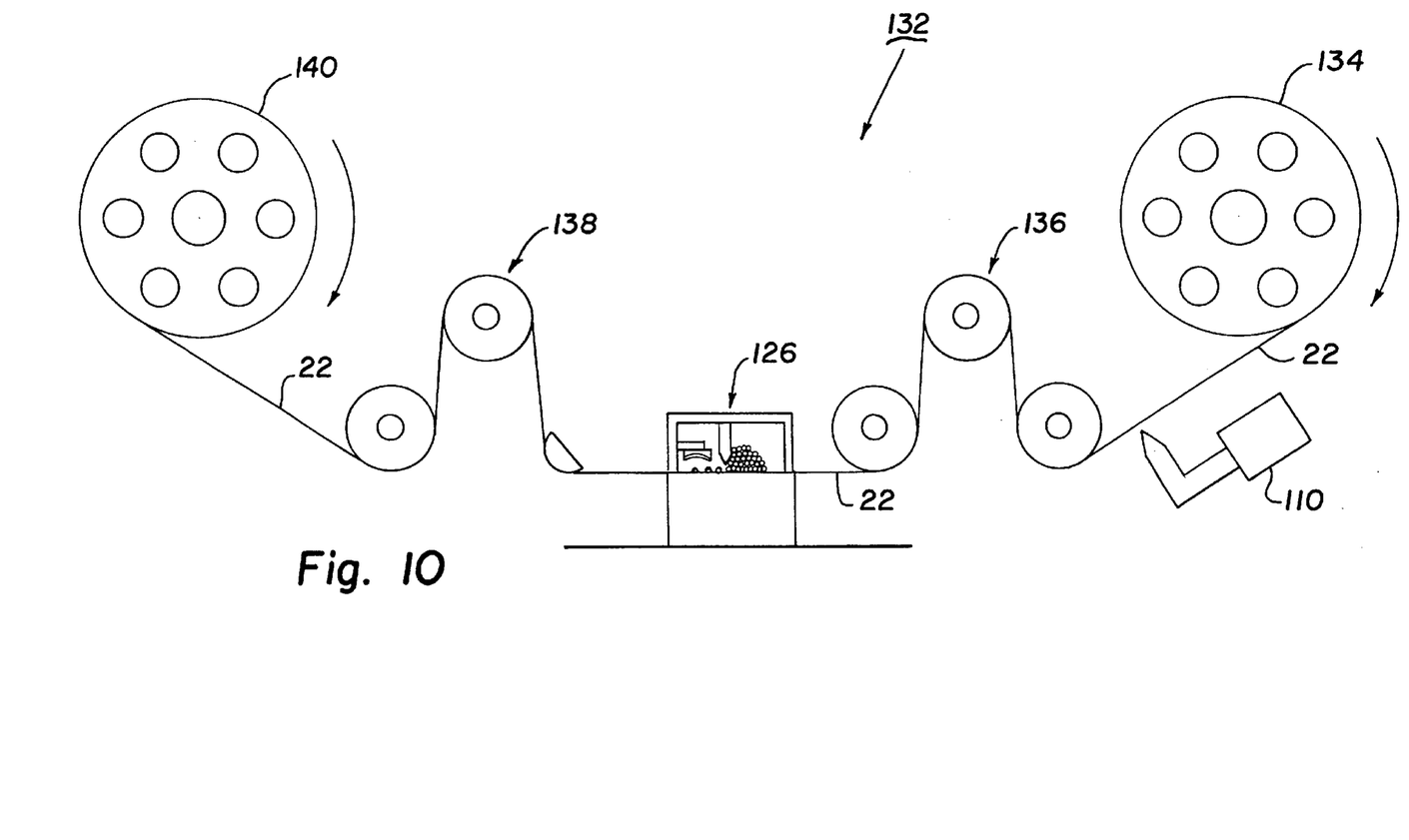
FIG. 10 is a diagrammatic representation of an automated fabrication system for manufacturing solder ball arrays.

An automated fabrication system 132 for manufacturing solder or metal ball arrays is shown in FIG. 10. The system 132 includes a membrane supply reel 134 holding and feeding a strip of array membrane 22 through first membrane tensioners 136 and then through the deposit system 126 to second membrane tensioners 138 and onto membrane takeup reel 140. It will be appreciated that the array membrane 22 may have various patterns of apertures 24 formed therein prior to being placed on membrane supply reel 134 or an aperture-forming system 110 (such as the excimer laser ablation system) may be positioned at a convenient location between the membrane supply reel 134 and deposit system 126.

Figures 11A, 11B:
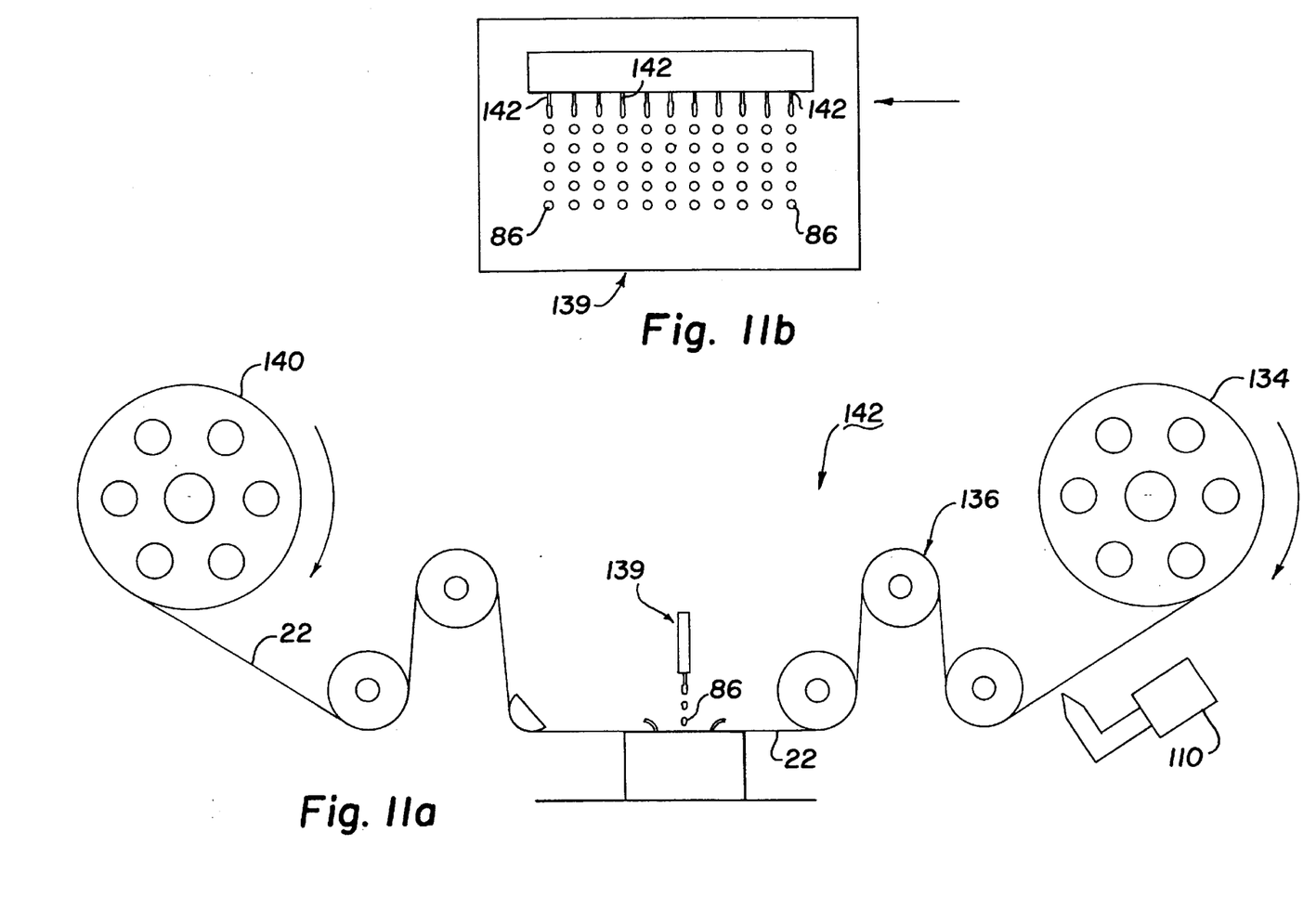

Another automated fabrication system 142 for manufacturing solder or metal ball arrays is shown in FIG. 11a. System 142 includes a membrane supply reel 134 holding and feeding an elongated strip of array membrane 22 through first membrane tensioners 136. The array membrane is then passed under a jet array printhead 139 to second membrane tensioners 138 and onto membrane takeup reel 140. It will be appreciated that the array membrane 22 may have various patterns of apertures 24 formed therein prior to being placed on membrane supply reel 134 or that an aperture-forming system 110 (such as the excimer laser ablation system) may be positioned at a convenient location between the membrane supply reel 134 and deposit system 126. The jet array printhead 139 (illustrated in FIG. 11b) includes multiple apertures 142 which eject liquid metal directly into apertures in array membrane 22 or onto the surface of the member 22. Jet array printhead 139 is synchronized with the movement and position of array membrane 22 so that metal balls 86 are ejected directly into the apertures 24 in array membrane 22. Such synchronization of movement of a target which receives ejected solder balls is disclosed in U.S. Pat. No. 5,193,738 which is incorporated herein by reference.

It will be appreciated that the automated fabrication system 142 may utilize an array membrane 22 which does not have apertures previously formed therein. In this embodiment, the jet array printhead 139 is positioned so that balls 86 landing on the surface of the array membrane 22 contain sufficient heat to temporarily partially melt the array membrane 22 at the point of contact. The balls 86 thus adhere to the array membrane 22 without having a pre-formed aperture at the point of contact. With proper control of the ejection apparatus, the metal balls will contain sufficient heat and momentum to form an aperture in the membrane 22 yet become lodged within the membrane occupying the apparatus thus formed.

It will be appreciated that metal ball arrays produced in accordance with the invention may be used in various different ways. For example, the array 20 may be used for interconnect bonding the metal pads 16 of a microelectronic device 10 or the like to the connect or bond pads 18 on substrate 12 as shown in FIG. 2. (It will be appreciated that solder balls 14 will not have been previously placed on metal pads 16 of the microelectronic device 10 as shown in FIG. 2 since the present invention eliminates the need for such placement.) The array 20 is positioned between microelectronic device 10 and substrate 12 with the solder balls 86 positioned between the metal pads 16 and the connect or bond pads 18 on substrate 12. Microelectronic device 10 is operatively (both electrically and physically) joined to substrate 12 by a solder reflow process with the array membrane 22 remaining in place between the microelectronic device 10 and substrate 12. It will be appreciated that the pattern of solder balls 14 in the array membrane 22 must be the same as the pattern of pads on the microelectronic device 10 and substrate 12.

Metal ball arrays may also be used for interconnect testing of a single microelectronic device 10 or a number of microelectronic devices 10 while removeably positioned on a substrate 12 or a test fixture. In this instance a metal ball array 20 (having balls of solder alloy, copper or copper coated with solder, etc.) is positioned between a microelectronic device a test fixture with the metal balls 86 of array 20 positioned between the metal pads 16 on the electronic device and the connect pads on the test fixture. The device is thus electrically connected (but not physically bonded) to the test fixture. The microelectronic device may then be tested by applying test signals and power thereto through the test fixture. After testing, the microelectronic device (and the solder ball array) may be removed from the test fixture for further testing, fabrication, use or destruction, depending on the results of the test. Alternatively, the microelectronic device may be properly positioned on a substrate to which it is to be permanently attached only if it passes certain tests. In this instance a metal ball array is positioned between the device and the substrate with a metal ball aligned to form electrical connection between each pad on the device and a contact or bond pad on the substrate. However, before the solder balls are reflowed to bond the device to the substrate, test signals and/or power is supplied thereto through the substrate and the metal ball array. If the device satisfactorily passes all required tests, the substrate is heated to reflow the solder balls and bond the device to the substrate without moveing the device. If not, the membrane device may simply be replaced.

From the foregoing it will be appreciated that the principles of the present invention may be employed to provide metal arrays for interconnect bonding and interconnect testing of microelectronic devices and their interfacing substrates. The arrays may be produced in various patterns and sizes as required and utilize metal balls of various sizes and compositions as required to perform the desired functions. Although the invention has been described with particular reference to presently preferred embodiments, it will be appreciated that various modifications, alterations, variations, etc., may be resorted to without departing from the spirit and scope of the invention as defined in the appended claims.

What is claimed:

1. An automated fabrication process for making a metal ball array which can be used for making electrical connections between micro-electronic parts, comprising the steps of:

providing an insulating membrane in the form of an elongated thermoplastic strip having opposed top and bottom surfaces;

providing a ball depositing station;

providing an apparatus for moving the membrane strip through the ball-depositing station;

providing a jet array printhead having a plurality of ejection devices which is located at the ball-depositing station, the printhead being positioned to eject substantially uniform diameter hot metal balls from one or more of said ejection devices onto a surface of the elongated strip;

moving the membrane by means of said apparatus; and operating the jet array printhead to eject and deposit said hot metal balls onto the elongated strip where they adhere in a pattern of solidified balls separated from each other by portions of the insulating membrane to form a metal ball array.

2. A process as set forth in claim 1 including the step of heating the membrane after said metal balls are injected onto said membrane.

3. A process as set forth in claim 1 wherein said metal balls are deposited at a high enough temperature to melt said insulating membrane sufficiently to become imbedded in the membrane, the balls extending from the top and bottom surfaces thereof.

4. A process as set forth in claim 1 wherein the step of providing an insulating membrane in the form of an elongated thermoplastic strip includes the step of providing an adhesive layer on the top surface to aid in adhering said balls to said strip and in mounting a severed section of said strip on a microelectronic device or part.

5. A process as set forth in claim 3 further including the step performed after said step of depositing said balls of providing an adhesive layer on a surface of said insulating membrane sufficient to adhere said metal ball array in a desired position on a microelectronic device or part.

6. A process as set forth in claim 1 wherein the step of moving the membrane comprises the step of moving the membrane through the ball-depositing station in a continuous manner.

7. A process as set forth in claim 1 wherein the step of moving the membrane comprises the step of indexing the membrane through the ball-depositing station in a non-continuous manner wherein the hot balls are deposited in said pattern after the membrane at the ball-depositing station is indexed.

8. A process as set forth in claim 6 wherein the apparatus for moving the membrane strip includes a membrane supply reel and the step of moving the membrane includes the step of unwinding the membrane from the supply reel.

9. A process as set forth in claim 7 wherein the apparatus for moving the membrane strip includes a membrane supply reel and the step of moving the membrane includes the step of unwinding the membrane from the supply reel.

10. A process as set forth in claim 1 wherein the step of providing an insulating membrane in the form of an elongated thermoplastic strip includes providing said strip with a pattern of uniform diameter apertures and the step of depositing said hot metal balls comprises the step of injecting into said apertures said metal balls having a uniform diameter which is greater than the diameter of said apertures.

11. A process as set forth in claim 10 further including the step of including a pattern forming station operated to provide said strip with said pattern of apertures before it reaches the ball-depositing station.

12. A process as set forth in claim 11 wherein said apertures are formed in said pattern forming station by:
 (i) masking a beam of laser energy to form a plurality of beams substantially corresponding to the number of apertures to be formed in said pattern;
 (ii) focussing said plurality of beams on the surface of said membrane in a pattern corresponding to the pattern of apertures to be formed; and
 (iii) ablating the membrane exposed to said plurality of beams to form a corresponding pattern of aperture.

13. An automated fabrication process for making a metal ball array which can be used for making electrical connections between micro-electronic parts, comprising the steps of:
 (a) providing a jet array printhead to produce metal balls of generally uniform diameter;
 (b) providing an insulating membrane having opposed top and bottom surfaces, the membrane having a thickness selected so that a pattern of ball receiving apertures which are slightly smaller than said generally uniform diameter can be created in the membrane to receive said metal balls therein with a portion of each ball extending above and below said surfaces;
 (c) forming said pattern of apertures in said membrane;
 (d) positioning the jet array printhead and said insulating membrane relative to each other such that metal balls of said generally uniform diameter can be produced at the printhead and one ejected toward each ball receiving aperture in said pattern of apertures;
 (e) operating said jet array printhead to eject metal balls of said generally uniform diameter into said apertures with a portion of each ball extending above the top surface and also below the bottom surface of the insulating membrane;
 (f) moving the insulating membrane relative to the jet array printhead; and
 (g) repeating steps (d), (e) and (f) until each one of said ball receiving apertures in said pattern of apertures receives one of the metal balls.

14. A process as set forth in claim 13 wherein the insulating membrane is moving while the jet array printhead is operated.

15. A process as set forth in claim 13 wherein the step of providing an insulating membrane in the form of an elongated thermoplastic strip includes the step of providing an adhesive layer on the top surface which can aid in adhering said balls to said strip and in mounting a severed section of said strip on a microelectronic device or part.

16. A process as set forth in claim 14 further including the step performed after said step of depositing said balls of providing an adhesive layer on a surface of said insulating membrane sufficient to adhere said metal ball array in a desired position on a microelectronic device or part.

17. A process as set forth in claim 13 wherein the apparatus for moving the membrane strip includes a membrane supply reel and the step of moving the membrane includes the step of unwinding the membrane from the supply reel.

18. A process as set forth in claim 17 wherein the apparatus for moving the membrane strip includes a membrane takeup reel and a tensioner for the membrane strip to control the membrane as the metal ball array is being fabricated.

19. A process as set forth in claim 14 wherein the apparatus for moving the membrane strip includes a membrane supply reel and the step of moving the membrane includes the step of unwinding the membrane from the supply reel.

20. A process as set forth in claim 19 wherein the apparatus for moving the membrane strip includes a membrane takeup reel and a tensioner for the membrane strip to control the membrane as the metal ball array is being fabricated.

21. A process as set forth in claim 13 wherein said apertures are formed in said pattern forming station by:
 (i) masking a beam of laser energy to form a plurality of beams substantially corresponding to the number of apertures to be formed in said pattern;
 (ii) focussing said plurality of beams on the surface of said membrane in a pattern corresponding to the pattern of apertures to be formed; and
 (iii) ablating the membrane exposed to said plurality of beams to form a corresponding pattern of aperture.

22. An automated fabrication process for making a metal ball array for making electrical connections between microelectronic parts, comprising:
 providing an insulation membrane strip in the form of an elongated thermoplastic strip having opposed top and bottom surfaces and a thickness;
 providing an apparatus for moving the membrane strip through a station, the apparatus including a supply reel on one side of the station and a takeup reel on the other side of the station and a means for tensioning the membrane strip as it passes through the station;
 moving the membrane strip through the station;
 providing an electromechanical ejection device at the station which is controlled to produce spherical hot metal balls of uniform diameter greater than the thickness of the strip wherein said metal ball diameter and the thickness of the membrane are selected to allow each ball to partially extend through the membrane; and depositing a plurality of said hot metal balls directly onto the surface of said insulating membrane in a desired ball array pattern, at a temperature which causes the metal balls to at least partially melt the insulating membrane and adhere thereto in said pattern.

23. A process as set forth in claim 22 wherein said metal balls melt said insulating membrane sufficiently to extend through the top and bottom surfaces thereof.

24. A process as set forth in claim 22 wherein the desired pattern in the form of apertures in the membrane strip are provided and the step of depositing a plurality of hot metal balls is performed by depositing said balls in said apertures with a portion of said balls extending from both surfaces of said membrane.

25. An automated fabrication process for making a metal ball array which can be used for making electrical connections between micro-electronic parts, comprising the steps of:

(a) providing an insulating membrane of a selected thickness having opposed top and bottom surfaces;

(b) providing an electromechanical ejection device which is controlled to eject hot metal balls of generally uniform diameter greater than said thickness;

(c) depositing a plurality of said hot metal balls directly onto the surface of said insulating membrane in a ball array pattern, so that the heat of the metal balls causes the metal balls to at least partially melt the insulating membrane and adhere thereto in said pattern; and (d) repeating steps (a), (b) and (c).

26. A process as set forth in claim 25 wherein said metal balls melt said insulating membrane sufficiently to extend through the top and bottom surfaces thereof.

27. A process as set forth in claim 25 wherein the desired pattern in the form of apertures in the membrane strip are provided and the step of depositing a plurality of hot metal balls is performed by depositing said balls in said apertures with a portion of said balls extending from both surfaces of said membrane.

* * * * *